United States Patent [19]
Worley

[11] Patent Number: 5,466,948
[45] Date of Patent: Nov. 14, 1995

[54] MONOLITHIC SILICON OPTO-COUPLER USING ENHANCED SILICON BASED LEDS

[75] Inventor: Eugene R. Worley, Irvine, Calif.

[73] Assignee: John M. Baker, Corona, Calif.; a part interest

[21] Appl. No.: 320,232

[22] Filed: Oct. 11, 1994

[51] Int. Cl.⁶ .............................. H01L 31/12; H01L 31/16
[52] U.S. Cl. .................................. 257/3; 257/77; 257/82; 257/84; 257/449
[58] Field of Search .................... 257/77, 82, 84, 257/85, 98, 59, 81, 80, 99, 447, 435, 434, 80, 81, 83, 3, 449, 455; 350/96.11, 96.12

[56] References Cited

U.S. PATENT DOCUMENTS 4,966,430  10/1990  Weidel .................................. 257/86 X

FOREIGN PATENT DOCUMENTS

| 58-92256 | 6/1983 | Japan | 257/84 |
| 63-102361 | 5/1988 | Japan | 257/84 |
| 1158782 | 6/1989 | Japan | 257/80 |
| 60-182779 | 9/1995 | Japan | 257/84 |

OTHER PUBLICATIONS

Namavar et al, "Visible Electroluminescence From Porous Silicon NP Heterojunction Diodes," *Appl. Phys. Lett.* 60 (20), 18 May 1992, pp. 2514–2516.

Canham et al., "1.3 μm Light–Emitting Diode From Silicon Electron Irradiated at its Damage Threshold," *Appl. Phys. Lett.* 51(19), 9 Nov. 1987, pp. 1509–1511.

Zhiming et al., "An Improved Structure of A–SiC:H Thin Film p–i–n junction LED," *1993 International Electron Devices Meeting*, 1993, pp. 221–224.

Konuma et al., "Standard–Television Compatible 648×487 Pixel Schottky–Barrier Infrared CCD Image Sensor," *IEEE Transactions on Electron Devices*, vol. 39, No. 7, Jul. 1992, pp. 1633–1636.

Primary Examiner—William Mintel
Attorney, Agent, or Firm—G. Donald Weber, Jr.

[57] ABSTRACT

A monolithic opto-coupler employing silicon-insulator technology in which at least two p-type silicon islands disposed on said insulating layer and a light emitting diode having enhanced light emitting efficiency is formed on one of said islands. The enhanced light emitting diode is either of the type having the surface of said p-type silicon island being electrochemically etched to provide a porous silicon layer, having carbon implanted in damaged silicon, or having an amorphous silicon-carbide layer. A silicon diode detector is formed on the other island(s) and a reflective layer is disposed over the light-emitting diode and the detectors for coupling light generated in the light emitting diode to the silicon diode detector.

7 Claims, 5 Drawing Sheets

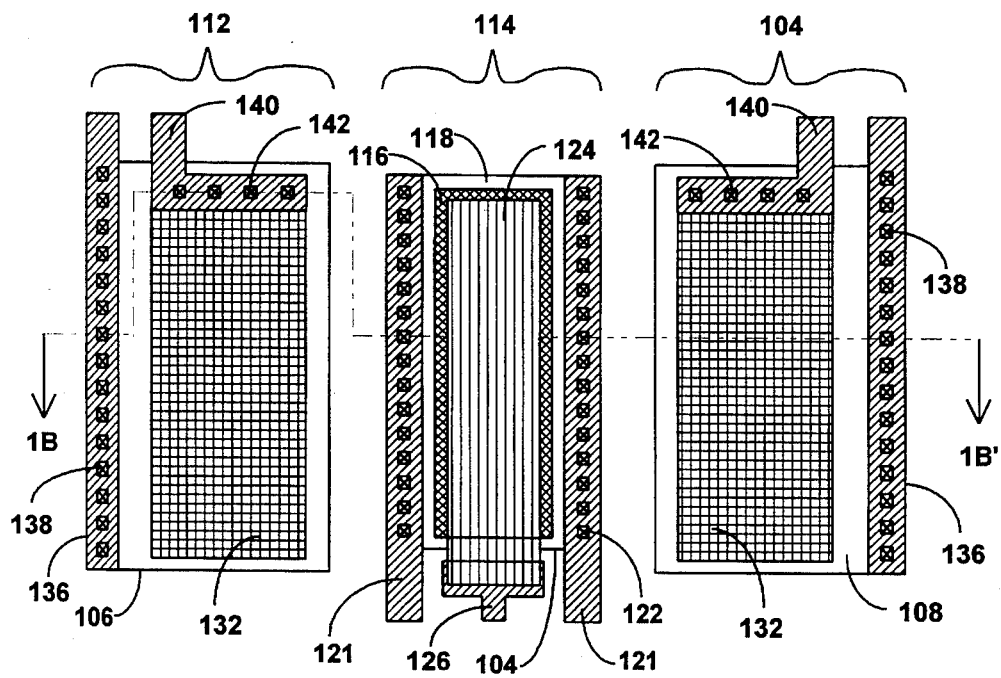
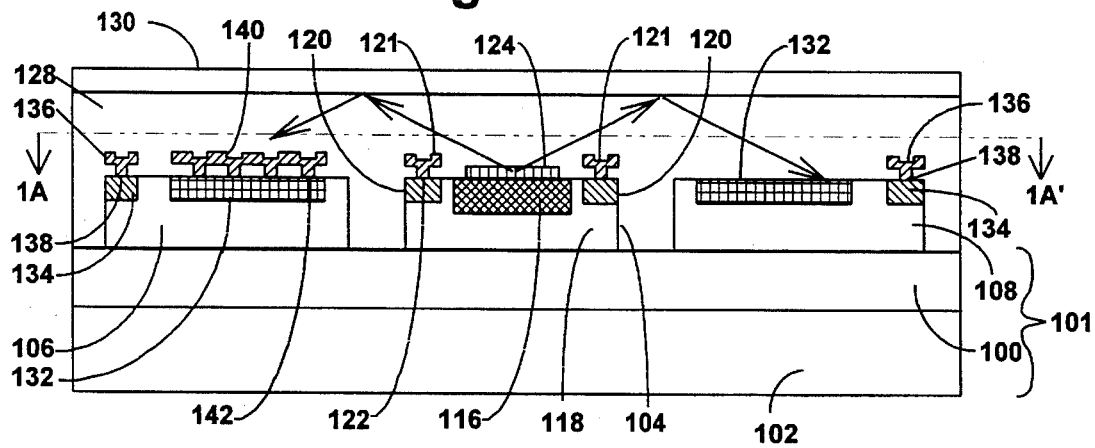

Die 5,466,948

MONOLITHIC SILICON OPTO-COUPLER USING ENHANCED SILICON BASED LEDS

BACKGROUND

1. Field of the Invention

This invention relates in general, to optical isolation circuits and, in particular, to optical isolation circuits which are fabricated using silicon integrated circuit techniques in conjunction with silicon-on-insulator substrates. The invention relates especially to monolithic silicon opto-couplers using silicon-based light emitting diodes.

2. Prior Art

Most optical isolator-couplers have used gallium arsenide (GaAs) based light emitting diodes (LEDs) and silicon based photo detectors to generate and receive an optical signal, respectively. Optical isolation circuits which use a GaAs LED and a silicon detector typically employ hybridization to make packaged opto-coupler units because of the very different processing conditions and materials required for the different devices. Silicon-on insulator (SOI) technology has emerged as a highly viable silicon technology for use in fabricating integrating circuits. A primary advantage of silicon technology is that, unlike hybrid processing, many devices can be included on a single die with the same amount of fabrication effort. SOI integrated circuits achieve component isolation via an intervening insulator rather than by back bias junctions as is the case with bulk silicon integrated circuits. However, the quantum efficiency of silicon diodes as a light source is very low when compared to that of forward biased GaAs diodes. Not only are GaAs LEDs more efficient at emitting light, but the wave length of the light emitted by a GaAs diode is readily absorbed by silicon which makes silicon detectors efficient at detecting light emitted by GaAs LEDs.

In the inventor's co-pending patent application, Ser. No. 08/139,818, entitled "OPTICAL ISOLATION CONNECTIONS USING INTEGRATED CIRCUIT TECHNIQUES", it was shown how a monolithic silicon opto-coupler can be made using a simple silicon diode as the LED in spite of its very low light output. A key in making a practical silicon monolithic opto-coupler using a simple silicon diode as an LED was to provide a powered low noise amplifier in conjunction with the silicon detector diode either separately or as an on chip device. This combination allows the use of the simple silicon LEDs with extremely low output levels including even the use of the simple silicon junction diode. It was shown that low speed optical couplers on SOI can be used as low cost digital isolation devices such as telephone and modem isolation devices. However, the band width of the monolithic silicon opto-coupler is limited unless increased levels of efficiency (greater than that of the simple junction diode) can be achieved from an LED whose fabrication is compatible with silicon processing.

SUMMARY OF THE INVENTION

It is therefor an object of the present invention to provide an improved silicon-based monolithic opto-coupler.

It is therefore an object of the present invention to provide a monolithic silicon opto-coupler in which the silicon based LED has a light emission efficiency greater than that of the simple junction diode.

Another object of the present invention to provide a monolithic opto-coupler having increased bandwidth that is compatible with silicon fabrication processing.

Another object of the present invention is to provide a monolithic silicon opto-coupler employing SOI integrated circuit technology.

Another object of the present invention is to provide a monolithic silicon opto-coupler employing a porous silicon LED on an SOI substrate in conjunction with standard silicon PN junction diodes as detectors.

Another object of the present invention is to provide a monolithic silicon based opto-coupler employing a silicon LED based on carbon implanted in damaged silicon.

A further object of the present invention is to provide a silicon based opto-coupler using a deposited amorphous silicon-carbide LED on an SOI substrate.

Briefly, these and other objects are provided by three silicon-based monolithic opto-couplers having improved bandwidth which utilize silicon based LEDs. In each opto-coupler, the LEDs and the associated diode detectors are fabricated on P-type silicon islands on an SOI substrate using conventional silicon fabrication technology. The specific LED structures provide improved light emission efficiency through the use of a porous silicon layer, a carbon implanted in damaged silicon layer, or amorphous silicon carbide layers in the light-emitting structure. Alternative methods of etching the silicon island to create the porous silicon layer during the fabrication of the opto-coupler are also disclosed.

The advantages and features of the present invention will become apparent from the following detailed description of the preferred embodiments of the invention when considered in conjunction with the accompanying drawings wherein like reference characters represent like parts throughout the several views and wherein;

BRIEF DESCRIPTION OF THE DRAWINGS

FIG. 1A is a top sectional view of a monolithic opto-coupler employing a porous silicon based LED on an SOI substrate taken along line 1A—1A' in FIG. 1B;

Fig. 1B is a sectional view of a monolithic opto-coupler of FIG. 1A taken along line 1B—1B' in FIG. 1A;

FIG. 2A, FIG. 2B, and FIG. 2C, illustrate a process for making the porous silicon layer in LED of FIG. 1 wherein FIG. 2A illustrates a wafer utilized in the manufacturing process;

FIG. 2B is a sectional view of the LED taken along line 2B—2B' in FIG. 2C, and

FIG. 2C is a sectional view of the LED taken along line 2C—2C' in FIG. 2B;

FIG. 3A and FIG. 3B illustrate an alternative process for making the porous silicon layer in the LED of FIG. 1 wherein FIG. 3A is a sectional view of the LED taken along line 3A—3A' in FIG. 3B;and FIG. 3B is a sectional view of the LED at the processing stage of FIG. 3A taken along line 3B—3B' in FIG. 3A;

DESCRIPTION OF THE PREFERRED EMBODIMENTS

Figure 2A:
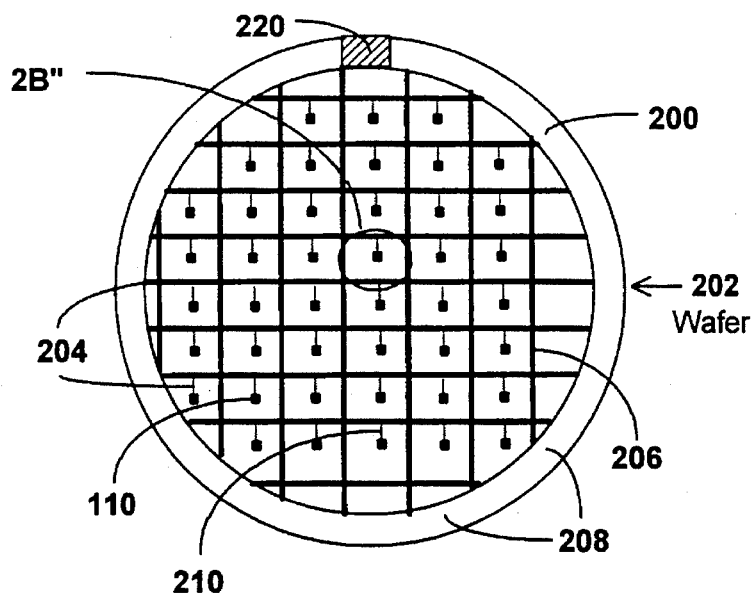

FIGS. 1A and 1B illustrate a first preferred embodiment of a monolithic opto-coupler having an enhanced silicon-based LED on a silicon-on-insulator (SOI) substrate employing a porous silicon based device as the enhanced LED. The substrate 101 consists of an insulating layer 100 which is typically $SiO_2$ deposited on a bulk silicon support wafer 102. A single-crystal film of P-type silicon, which is deposited on the insulating layer 100, is etched to form side-by-side islands 104, 106 and 108 of P-type silicon from which the center island LED 110 and the adjacent detector diodes 112 and 114, respectively, are made.

The porous silicon LED 110 is made by electrochemically etching the surface of P-type silicon (0.3 to 14 Ohm-cm) as described in "Visible Electro-luminesence from Porous NP Heterojunction Diodes" by F. Namavar et al., *Applied Physics Letters*, Vol. 60, No. 20, May 1992 (pg. 2514), which is incorporated herein by reference. This etching reaction forms a central layer 116 of silicon "wires" or porous silicon which will emit a red, orange, yellow, or green light depending on the etch conditions. The preferred processes for electrochemically 0 etching the porous silicon will be described more fully in connection with FIGS. 2A—2C and FIGS. 3A and 3B. The voltage drop required for light emission is only a few volts.

The unetched part 118 of the P-type silicon island 104 forms the bottom electrode i.e. the anode, of the LED 110. Two P+ diffusion regions or implants 120 are provided at the edges of the top surface of the P-type silicon island 104— one implant on each side of the porous silicon layer 116. These diffusion implants 120 couple the anode 118 of P-type island 104 to metal (typically aluminum) interconnect lines 121 via contacts 122 for connecting metal-to-P+ implants. The interconnect lines 121 in turn couple the anode 118 of LED 110 to other on-chip devices or external devices or signals.

The upper electrode or cathode 124 of the LED 110 is an N-type transparent indium tin oxide (ITO) layer disposed on the top surface of the etched porous silicon layer 116. This transparent ITO electrode 124 allows light generated in the porous silicon layer 116 to be emitted from the porous layer through the electrode. The ITO layer 124 forms a heterojunction with the underlying porous silicon 116. As shown in FIG. 1A, the ITO electrode layer 124 extends beyond the LED island 104 and overlaps and, thus, contacts a metal connector line 126 to which it is coupled for connecting the cathode electrode 124 of the LED 110 to other on-chip devices or external devices or signal sources.

A waveguide channels light, represented by the arrows in FIG. 1B, generated in the porous silicon layer 116 to the adjacent detector diodes 112 and 114. The waveguide is formed by covering the LED 110 and detectors 112 and 114 in (with) a transparent deposited $SiO_2$ layer 128 and then depositing a layer of reflecting material such as aluminum layer 130 on the $SiO_2$ layer.

Since the light emitted from the porous silicon LED 110 is in the visible spectrum, a standard silicon PN junction diode is suitable as the detectors 112 and 114. For green light, for example, the absorption constant is about 1.0 μm. Therefore, in 2 μm of silicon more than 86% of the light is absorbed. As shown in FIGS. 1A and 1B, the diodes 112 and 114, accordingly, are formed incorporating a shallow N+ diffusion region or implant 132 in the center of the top surface of the P-type islands (island 106 or 108). The N+ diffusion regions 132 and the P-type island 106 or 108 operate as the cathode and the anode, respectively, of the detector. Each detector's P-type anode (island 106 or 108) has a P+ diffusion region or implant 134 which is connected to a metal interconnect line 136 by a metal-to-P+ diffusion contact 138. As shown in FIG. 1A, the N+ diffusion region or implant (cathode 132) of each detector is coupled to a metal interconnect line 140 by metal-to-N+ diffusion contacts 142.

Figure 2B:
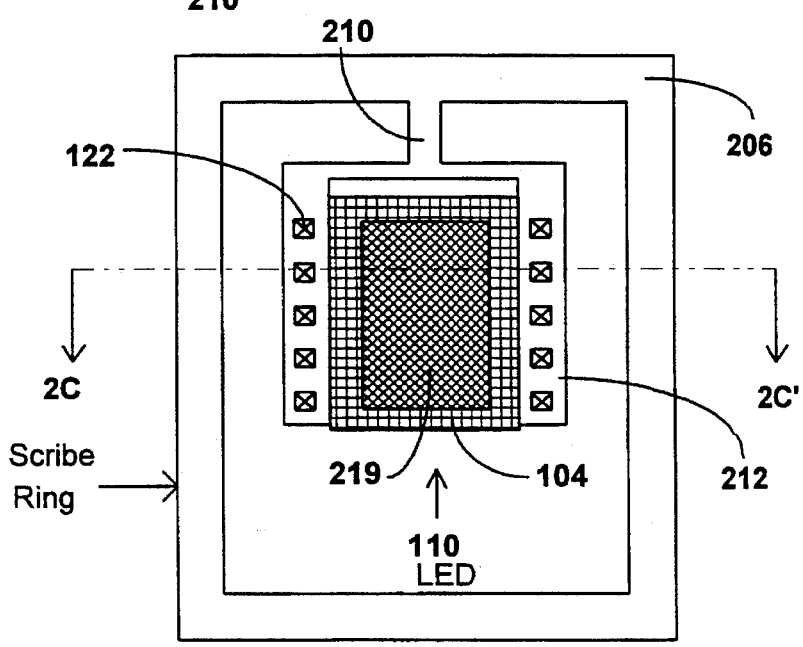
Figure 2C:
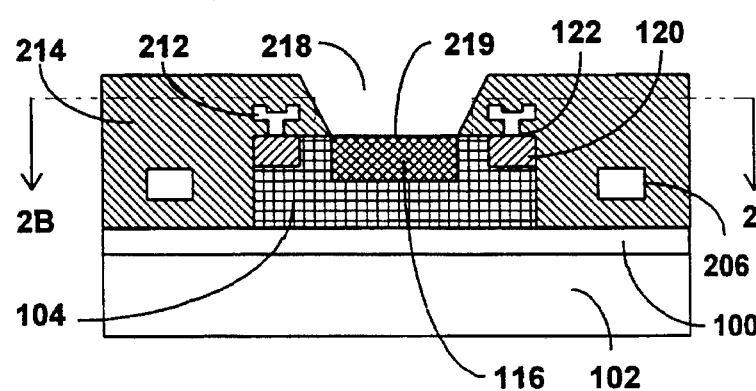

Referring now to FIGS. 2A–2C, these figures illustrate a process for electrochemically etching (i.e., anodizing) the surface of the P-type silicon island 104 to make the porous silicon layer 116. In this process, the electrochemical etching of the silicon surface occurs after the other elements of the monolithic opto-coupler such as the detector diodes 112 and 114 and any additional on-chip circuitry or devices such as transistors or amplifiers which are incorporated in the opto-coupler is deposited over have been fabricated. In a first step, a metal layer 200, commonly aluminum or an alloy of aluminum, is deposited over a wafer 202 containing multiple monolithic opto-couplers in process. The metal layer 200 is then etched to expose the LEDs 110 and also to form a metal interconnect pattern, generally designated as 204, and shown in FIG. 2A. To anodize the light emitting area 116 of the LED's 110, the interconnect pattern 204 includes a scribe line 206 to provide an interconnect electrical path for anodizing the LED surfaces. The interconnect pattern 204 also includes a metal ring 208 which provides a contact point 220 for the application of the anodizing voltage. As shown in FIG. 2B, a metal line 210 is also run from the scribe line conductors 206 to a contact ring 212 which surrounds each LED 110. Thus the scribe line 206 contacts the P-type silicon region 116 of all of the LED silicon pads 104 on the wafer 202.

After the interconnect metal pattern 204 has been deposited and etched, a protective layer 214 is deposited over the wafer 202. This protective layer 214 is ideally silicon oxide or deposited $SiO_2$ with a silicon-nitride cap (a silicon nitride cap is not illustrated). A masking layer (not shown) is then applied to the wafer 202 and openings 218 are etched down to bare silicon over the LED pad areas 219 on the surface of the silicon islands 104. In addition, an area 220 over the scribe line metal at the end of the wafer 202, as shown in FIG. 2A is also exposed by the etch. One terminal of the anodizing power supply (not shown) is coupled to this exposed area 220. The remaining part of the wafer 202 is submerged in a suitable anodizing solution such as hydrofluoric acid which makes contact to the other power supply terminal.

As disclosed in F. Namavar et al., *Applied Physics Letters*, Vol. 60, No. 20, May 1992 (pg. 2514), currents as low as 2 $mA/cm^2$ can be used to etch the silicon LED pad area 219 to form the porous silicon layer 116. This low current density helps ensure that voltage drops across the P-type region 104 of the LED area being etched will be small thus ensuring a uniform etch. For example, at all etch current density of 2 $mA/cm^2$ a 100 μm×20 μm LED pad would require only 40 nA. After the anodizing etch of the silicon surface, a masking step is performed to remove the metal line 210 which connects the scribe line conductor 206 to the contact ring 212 of the LED. This is accomplished by etching a hole in the oxide-nitride protective layer 214 (or other suitable protective layer) and then etching away the aluminum trace 210. This line is removed so that LED 110 remains connected only to opto-control circuits specific to the individual die as shown in FIG. 2B.

When two or more levels of metal are present, the upper most metal layer serves as the conductor for the anodizing process. Vias (not shown) are used to connect the top metal layer with the first layer with connects to the diffusion or implant region which rings the area to be anodized. After the trace 210 is etched away, the N-type transparent ITO layer 124 is deposited over the porous silicon 116 (and also over the metal contact tab 126) as shown in FIG. 1. The $SiO_2$ layer 128 is then deposited to cover the opening 218. The surface of the opto-coupler is then planarized and the reflective waveguide metal 130 is deposited (See FIG. 1). Finally, a protective passivation overcoat (not shown) is applied to the wafer 202.

Figure 3A:
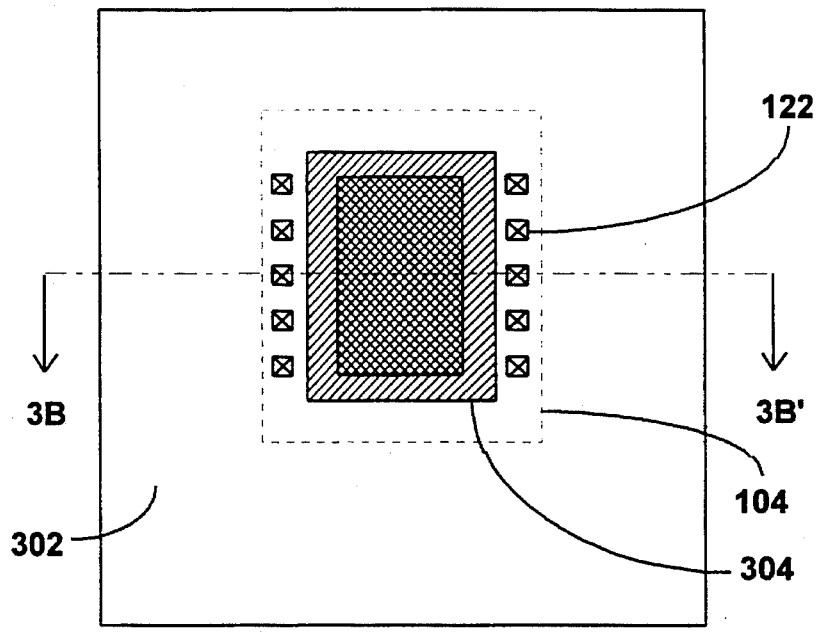
Figure 3B:
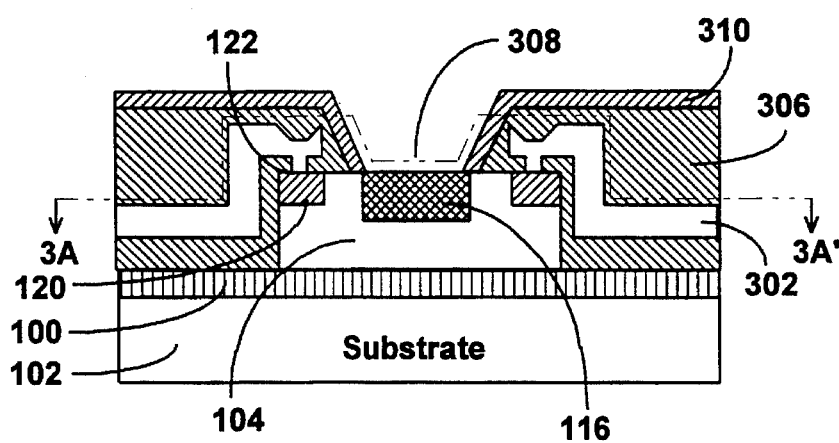

An alternative process for anodizing the silicon island 104 of LED 110 is illustrated in FIGS. 3A and 3B. As represented by die 300, a metal layer 302 is deposited over the entire wafer (see wafer 202 in FIG. 2A) and a hole 304 is etched in the metal layer 302 over the P-type silicon island 104. Note that the metal layer 302 makes contact to the P+ implant 120 which in turn contacts to the P-type island substrate 104. Next, an $SiO_2$ layer 306 is deposited over the wafer 202 and a hole is etched exposing the silicon surface 308 to be anodized. A silicon nitride layer 310 is then deposited on the wafer 202 and a somewhat smaller hole is etched therein over the silicon surface 308 so that the $SiO_2$ sidewall 314 is covered with silicon nitride. This blocking silicon nitride layer 310 prevents the anodizing etch from reaching any surfaces of the LED other than the top of surface 308 of the P-type silicon island 104.

As in the alternate fabrication process illustrated in FIG. 2A–2C, a hole (similar to hole 220 in FIG. 2A) is etched into the blocking layer 310 at the edge of the wafer 202 to expose the metal interconnect ring of the wafer 202 for contact to the anodizing power supply (not shown). The wafer 202, except for this power supply contact, is then submerged in an anodizing solution such as hydrofluoric acid. The anodizing voltage is applied between the solution and the metal interconnect ring contact at the edge of the wafer 202. Since the metal layer 302 is electrically coupled to the LED's P-type silicon island 104, a porous layer 116 of silicon will form. After the porous layer 116 is formed, the deposited silicon nitride layer 310 and the $SiO_2$ layer 306 are stripped and the metal is etched to form the interconnect pattern as required by the opto-coupler circuitry.

Finally, as in the other alternate process described in connection with FIG. 2A–2C, the N-type transparent ITO layer 124 is deposited over the porous silicon 110 and also over the metal contact tab 126 (See FIG. 1). After $SiO_2$ layer 128 is deposited to cover the opening over the electrode 124, the surface of the opto-coupler is planarized and the reflective waveguide metal 130 is deposited (See FIG. 1). Finally, a protective passivation overcoat (not shown) is applied to the wafer 202.

Figure 4A:
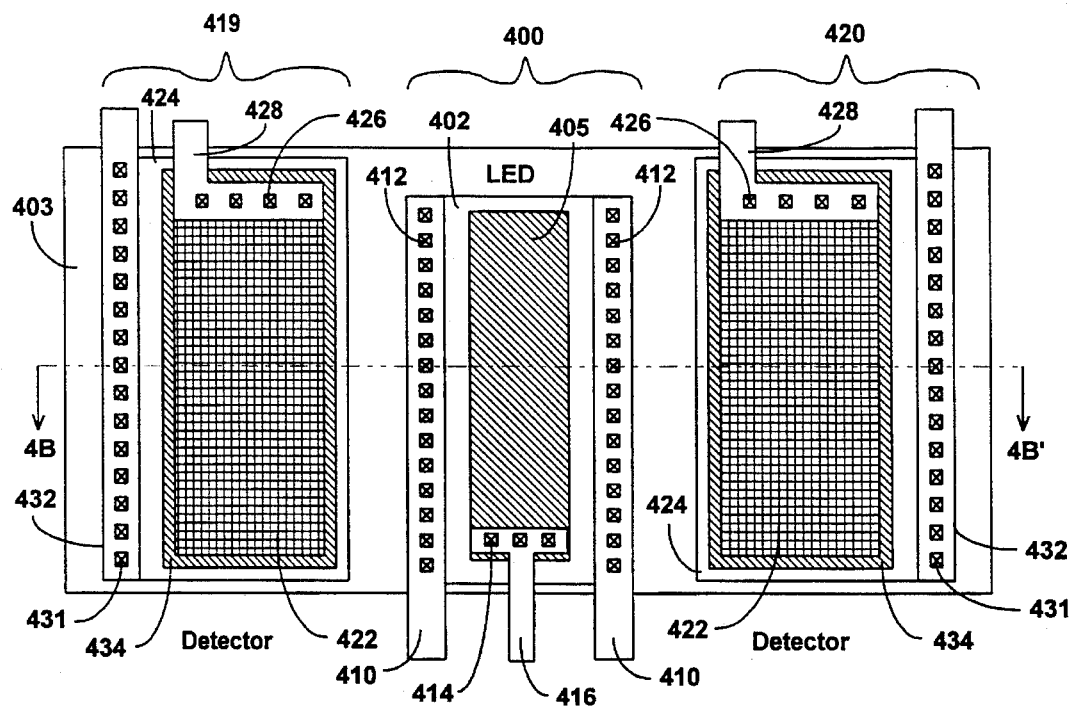
FIG. 4A is a sectional view of a monolithic opto-coupler using a carbon implanted and damaged silicon LED taken along line 4A—4A' in FIG. 4B.
Figure 4B:
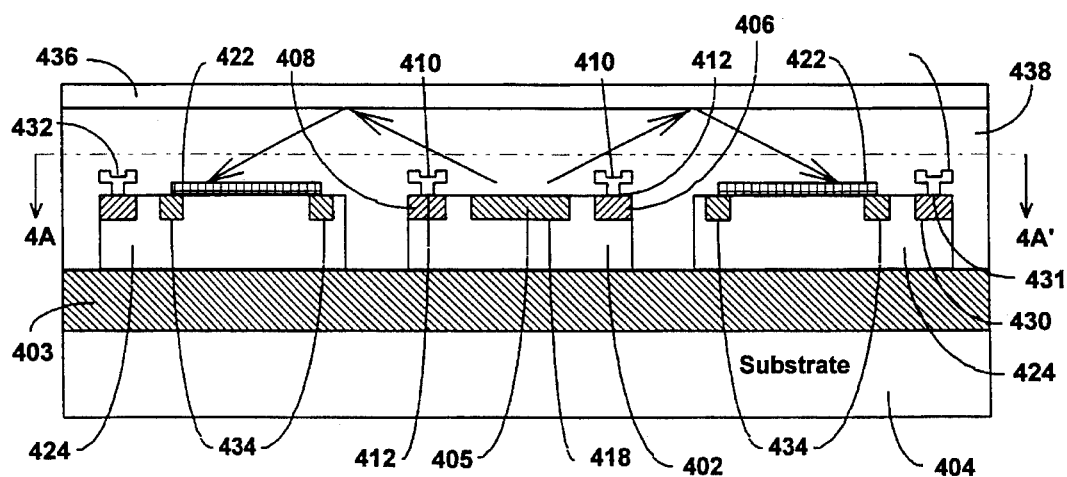
FIG. 4B is a sectional view of the opto-coupler using a carbon implanted and damaged silicon LED shown in FIG. 4A taken along line 4B—4B' in FIG. 4A.

FIGS. 4A and 4B illustrate a second preferred embodiment of a monolithic opto-coupler having an enhanced silicon-based LED on an SOI substrate employing a carbon implanted in damaged silicon based device as the enhanced LED 400. A carbon implanted in damaged silicon LED is described in "1.3 μm Light-Emitting Diode from silicon electron Irradiated at its Damage Threshold" by L. Canham et al., *Applied Physics Letters*, Vol. 51, No. 19, Nov. 1987, pp. 1409–1411, which is incorporated herein by reference.

In this embodiment, a conventional silicon based LED 400 is formed in a P-type silicon island 402 disposed on a typical SOI substrate including an oxide insulating layer 403 disposed on a silicon support layer 404. The LED 400 has a cathode formed by a shallow center N+ diffusion 405 and an anode formed by P+ diffusion implant regions 406 and 408 on each side of the center cathode 405. A metal interconnect line 410 is connected to the P+ diffusion implants 406 and 408 by metal-to-diffusion contacts 412. The N+ diffusion 405 is coupled by metal-to-diffusion contacts 414 to metal interconnect line 416.

At the end of the conventional fabrication process, a heavy carbon implant is injected into the diode junction area 418 between the N+diffusion 405 and the P-type silicon island 402. Also, an electron implant can be performed to enhance damage as described in L. Canham et al., *Applied Physics Letters*, Vol. 51, No. 19, November 1987, pp. 1409–1411. These implant steps must be performed at the end of the fabrication process so that they are subsequent to the high temperature annealing associated with the fabrication of MOS transistors or other on-chip devices which may be fabricated on the monolithic opto-coupler.

Since carbon implanted into damaged silicon emits light at a photon energy below that of the bandgap energy of silicon, an infrared detector must be fabricated to make the coupler. Such an infrared detector can be made using a Schottky barrier diode wherein photons of energy greater than the metal semiconductor work function can photo-excite carriers into the conduction band at the silicon metal interface. In "A Standard-Television Compatible 648×487 Pixel Schottky-Barrier Infrared CCD Image Sensor" by Konuma et al., appearing the *IEEE Transactions On Electron Devices*, July, 1992, pp. 1633–1637, which is incorporated herein by reference, a Schottky barrier image sensor is described using platinum-silicide on P-type silicon.

Referring to FIG. 4A and 4B, Schottky barrier diodes 419 and 420 are used as the photo detectors. The diodes 419 and 420 include a platinum-silicide cathode 422 disposed on a P-type silicon island 424 which functions as the device anode. A platinum-silicide to aluminum contact 426 couples the cathode 422 to metal interconnect 428. A P+ diffusion or implant 430 in the P-type island 424 (the anode) is coupled by P+ diffusion-to-metal (aluminum) electrical contact 431 to a metal interconnect 432. An N+ guard ring diffusion 434 is provided in the P-type silicon island 424 below the edges of the cathode 422.

As in the case of the embodiment of FIGS. 1A and 1B, a reflective layer 436 is deposited over a deposited $SiO_2$ layer 438 in order to guide the light, as represented by arrows 440, from the LED 400 to the photo-detecting diodes 419 and 420. A passivation layer (not shown) may be disposed on the reflective layer 436.

Figure 5A:
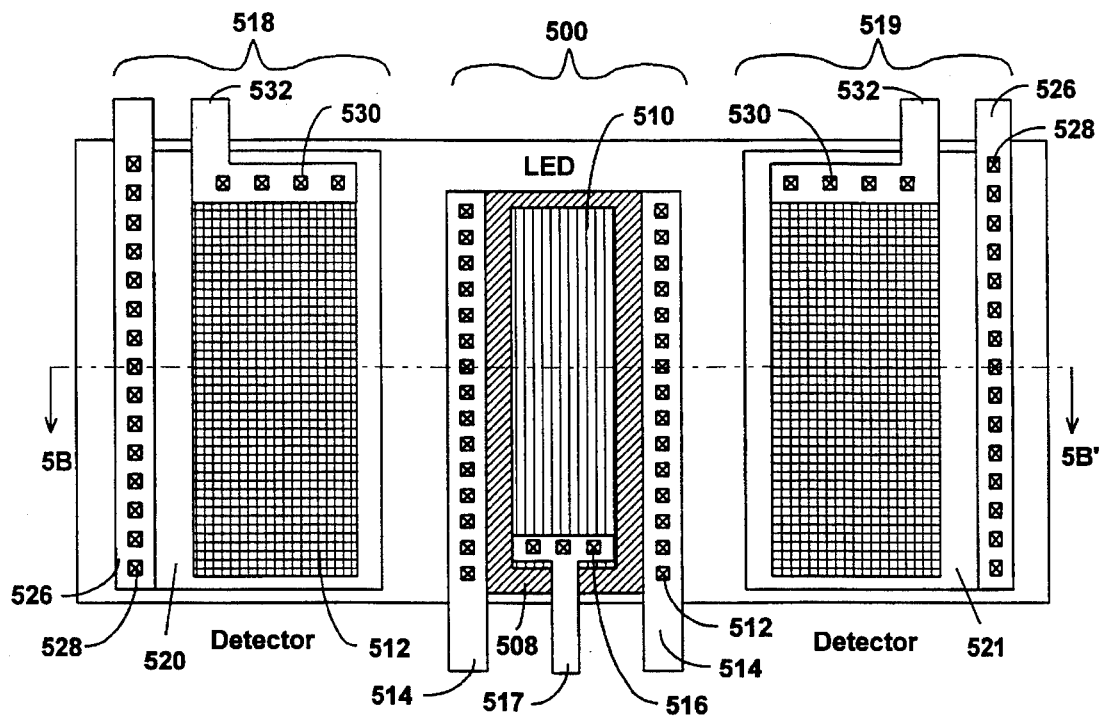
FIG. 5A is a sectional view of the opto-coupler using a deposited amorphous silicon-carbide LED taken along line 5A—5A' in FIG. 5B.
Figure 5B:
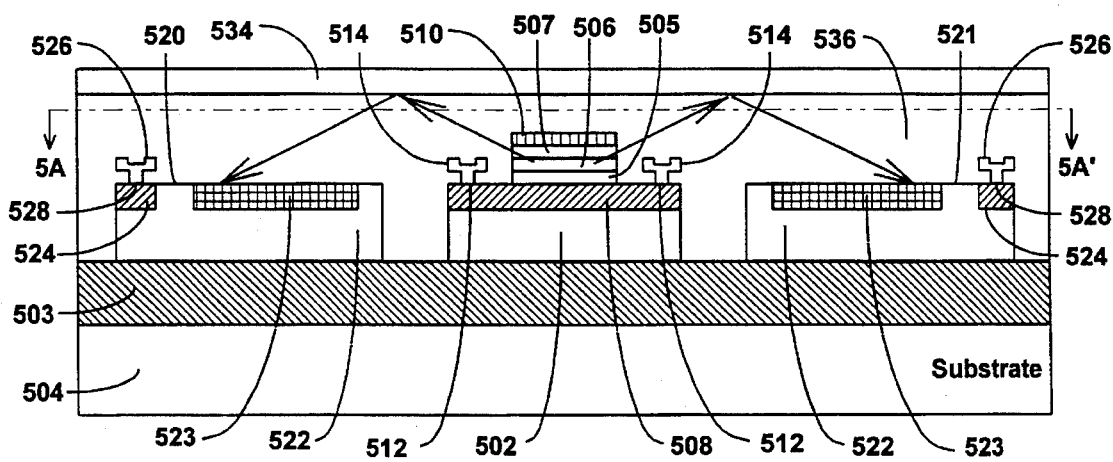
FIG. 5B is a sectional view of the opto-coupler using a deposited amorphous silicon-carbide LED taken along line 5B—5B' in FIG. 5A.

FIGS. 5A and 5B illustrate a third preferred embodiment of a monolithic opto-coupler having an enhanced silicon-based LED on an SOI substrate employing a deposited amorphous silicon-carbide LED 500. As was the case in the previous embodiments, the LED 500 is formed in a P-type silicon island 502 on an insulating oxide layer 503 disposed on a bulk silicon substrate 504. The LED 500 includes three film layers of hydrogenated silicon carbide as described in "An Improved Structure of a—SIC: H Thin Film p—i—n Junction LED" by Chen Zhiming et al., 1993 *International Electron Devices Meeting*, pp. 221–224, which is incorporated by reference herein. The three film layers include an N-type layer 505, an intrinsic layer 506 deposited on layer 505, and a P-type layer 507 deposited on layer 506. These silicon carbide film layers 505, 506 and 507, which are deposited at temperatures around 200° C., can be deposited after the high temperature annealing associated with the fabrication of MOS transistors or other on-chip devices which may be fabricated on the monolithic opto-coupler.

The N-type layer 505 of the silicon carbide stack is deposited on a heavily doped N-type silicon diffusion region 508 in the center of the top of the P-type silicon island 502. The contact for the P-type silicon-carbide top layer 507 is provided by an ITO layer 510 deposited on top of this layer 507. The transparent ITO electrode 510 allows light to pass out of the LED 500 as well as providing a contact to the LED anode.

The cathode connection to the LED 500 is made by contacting the silicon island N+ diffusion 508 with a N+ diffusion-to-metal contact 512 to a metal (e.g. aluminum) interconnect line 514. To bring out the LED anode, contact 516 is made between the ITO layer 510 and an aluminum interconnect line 517.

Since silicon carbide emits yellow to green light, standard silicon junction diodes 518 and 519 on P-type silicon islands 520 and 521 are used to detect the emitted light, as shown. As also used in the embodiment of FIG. 1A and 1B, the diodes 518 and 519 include a P+ diffusion 522 which is used to as the detector anode and an N+ diffusion region 523 which is used as the cathode. An N+ diffusion plug 524 in the silicon islands 520 and 521 makes contact to an aluminum interconnect line 526 through a diffusion-to-metal contact 528.

N+ diffusion to metal contacts 530 are provided at the end of the N+ diffusion region 523 (the cathode) for connection of the cathode to a metal interconnect line 532. As represented by the arrows 590, light emitted from the silicon carbide LED 500 is directed to the diode detectors using a reflective layer 534 deposited on a transparent encapsulent 536 such as silicon oxide (deposited $SiO_2$). A passivation layer (not shown) may be disposed on the reflective layer 534.

Obviously, many modifications and variations of the present invention are possible in light of the above teachings. It is therefore to be understood that within the scope of the appended claims, the invention may be practiced otherwise than as specifically described.

I claim:

1. A monolithic opto-coupler employing silicon-on-insulator technology comprising:

a substrate including an insulating layer disposed on a bulk silicon support layer;

a least two p-type silicon islands disposed on said insulating layer;

a light emitting diode having enhanced light emitting efficiency formed on one of said islands, said light emitting diode being selected from the group of
   a light emitting diode having the surface of said p-type silicon island being electrochemically etched to provide a porous silicon layer,
   a light emitting diode having carbon implanted in damaged silicon, and
   a light emitting diode having an amorphous silicon-carbide layer;

a silicon diode detector being formed on one of said islands; and a waveguide means for coupling light generated in said light emitting diode to said silicon junction diode.

2. The monolithic opto-coupler as recited in claim 1 wherein said light emitting diode comprises:

a light emitting diode formed on one of said islands, the surface of said p-type silicon island being electrochemically etched to provide a porous silicon layer.

3. The monolithic opto-coupler as recited in claim 1 wherein said light emitting diode comprises:

a light emitting diode formed on one of said islands including the surface of said one of said p-type silicon islands being electrochemically etched to provide a porous silicon layer at the surface of said island, an N-type transparent ITO layer disposed on the porous layer, and connecting means for coupling an external signal between said ITO layer and said p-type island.

4. The monolithic opto-coupler as recited in claim 1 wherein said light emitting diode comprises a light emitting diode having an amorphous silicon-carbide layer.

5. The monolithic opto-coupler as recited in claim 1 wherein said light emitting diode comprises:

a light emitting diode formed on one of said islands including an N+ diffusion layer on the surface of said one of said p-type silicon islands, a heavy carbon implant injected into the junction between the N+ diffusion layer and said p-type silicon island, and connecting means for coupling an external signal between said N+ diffusion layer and said p-type island.

6. The monolithic opto-coupler as recited in claim 5 wherein said silicon diode detector comprises:

a Schottky barrier silicon diode detector formed on another one of said at least two islands.

7. The monolithic opto-coupler as recited in claim 1 wherein said light emitting diode comprises:

a light emitting diode formed on one of said islands including an N-type diffusion layer on the surface of said one of said p-type silicon islands, an N-type layer of silicon carbide disposed on said N-type diffusion layer, an intrinsic silicon carbide layer disposed on said N-type silicon carbide layer, and a P-type silicon carbide layer disposed on said intrinsic silicon carbide layer, and connecting means for coupling an external signal between said P-type silicon carbide layer and said N-type diffusion layer.

* * * * *